United States Patent
Badikov et al.

(10) Patent No.: US 7,558,304 B2
(45) Date of Patent: Jul. 7, 2009

(54) SINGLE CRYSTAL LASER MATERIAL AND SYSTEM CONTAINING THE SAME MATERIAL

(76) Inventors: Dmitri Valer'evich Badikov, 23 Pushkin Street, #13, Krasnodar (RU); Valeri Vladimirovich Badikov, 23 Pushkin Street, #13, Krasnodar (RU); Tasoltan Tazretovich Basiev, 22/1 Domodedovskaya Street, #498, Moscow 115551 (RU); Maxim Evgen'evich Doroshenko, 31 6-th Kozhukhovskaya Street, #50, Moscow 109193 (RU); Sergey Borisovich Mirov, 2413 Jacobs Rd., Birmingham, AL (US) 35216; Yurii Vadirnirovich Orlovskii, 5/2 Akademika Anokhini Street, #207, Moscow 119571 (RU); Vyacheslav Vasil'evich Osiko, 43 Profsoyuzmaya Street, #464, Moscow 117420 (RU); Galina Sergeevna Shevirdyaeva, 23 Pushkin Street, #13, Krasnodar (RU)

( * ) Notice: Subject to any disclaimer, the term of this patent is extended or adjusted under 35 U.S.C. 154(b) by 0 days.

(21) Appl. No.: 11/357,870

(22) Filed: Feb. 17, 2006

(65) Prior Publication Data
US 2007/0211779 A1 Sep. 13, 2007

(51) Int. Cl.
*H01S 3/16* (2006.01)
*C09K 11/56* (2006.01)
(52) U.S. Cl. .................................. 372/41; 252/301.4 S
(58) Field of Classification Search .................... None
See application file for complete search history.

(56) References Cited
OTHER PUBLICATIONS

N. N. Musaeva, R. B. Dzhabbarov, U. F. Kasumov, and K. B. Ganbarova, "Optical and photoelectric properties of single-crystal PbGa2S4," J. Opt. Technol. 70, 676-679 (2003).*

Basiev, Orlovskii, Galagan, Doroshenko, Vorob'ev, Dmitruk, Papashvili, Svortsov, Konyushkin, Pukhov, Ermakov, Osiko, Prokhorov, and Smith Evaluation of Rare-Earth Doped Crystals and Glasses for 4-5 μm Lasing, in Laser Physics, (2002): p. 859-877, vol. 12, No. 5.

Orlovskii, Basiev, Pukhov, Glushkov, Alimov and Mirov, Multiphonon Relaxation of Mid-IR Transitions of RE Ions in Fluorite Type Crystals, Advanced Solid State Photonics Conference, Technical Digest, Feb. 1-4, 2004, Santa Fe, USA, WB9. OSA TOPS.

Nostrand, Page, Payne, and Krupke and Schunemann Room Temperature Laser Action of 4.3-4.4 m in $CaGa_2S_4Dy^{3+}$ "Optic Letters", vol. 24, No. 17, p. 1215-1217, 1999.

* cited by examiner

*Primary Examiner*—Minsun Harvey
*Assistant Examiner*—Sean Hagan
(74) *Attorney, Agent, or Firm*—Lackenbach Siegel, LLP; Myron Greenspan

(57) ABSTRACT

The invention relates to laser materials and specifically to single crystal active media for solid state lasers operating in the middle-infrared (Mid-IR) 4-5 μm range of optical spectrum, wherein a cross section of stimulated emission and laser wavelength is shifted to the range of atmospheric transparency with a single crystal orthorhombic structure with space group $D^{24}_{2h}$-Fddd. The material contains Lead, Gallium, Sulfur and is doped with Dysprosium according to general formula: $Pb_{1-3x}Dy_{2x}Ga_2S_4$, where $0.0001<x<0.05$. Lasers operating in this matter and in this spectral range are advantageous for lidar applications, free space communication, environmental monitoring, and other purposes.

7 Claims, No Drawings

SINGLE CRYSTAL LASER MATERIAL AND SYSTEM CONTAINING THE SAME MATERIAL

BACKGROUND OF THE INVENTION

1. Field of the Invention

The present invention relates to a single crystal laser material. More specifically, the present invention relates to a single crystal active media for solid-state lasers operating in the middle-infrared (Mid-IR) 4-5 μm range of optical spectrum.

2. Description of the Related Art

Solid state lasers operating in the middle-infrared (Mid-IR) 4-5 μm range of optical spectrum are preferable for practical reasons. Laser radiation of 4-5 μm spectral range is essential for many scientific, technological and defense related military applications. This radiation corresponds to so-called "window of atmospheric transparency" of the Earth, which in turn leads to small losses when the radiation propagates in the atmosphere. Lasers and lasing devices operating in this spectral range are advantageous for LIDAR (broadly a laser radar or light direction and ranging and sensing) applications, free space communication, environmental monitoring, and in many other industrial uses.

The word "laser" is an acronym for Light Amplification by Stimulated Emission of Radiation. Lasers are finding an ever increasing number of defense applications, for example in the involving target acquisition, fire control, and training. These lasers are termed rangefinders, target designators, and direct-fire simulators. Lasers are also being used in communications, laser radars (LIDAR) (as noted above), landing systems, laser pointers, guidance systems, scanners, metal working, photography, holography, medicine and in many other ways.

As noted earlier, LIDAR is an acronym for light direction and ranging, and is often a laser remote sensing technique used in science, industry, defense, and homeland security. As a remote sensing technique, it is broadly the optical equivalent of the microwave radar, and so is often referred to as laser radar. In an Atmospheric-Optics Laboratory, lidars are used for atmospheric research, and to obtain measurements of aerosol particulates, clouds, temperatures and water vapor. For example, Lidar measurements are useful in the study of transboundary pollution transport and Arctic climate change. For an example of a practical lidar system (including the certain technical details and measurements), see the Dalhousie Raman Lidar (http://aolab.phys.dal.ca/pages/DalhousieRamanLidar) or the MIT Firepond Lidar (http://www.haystack.mit.edu/).

In common practice, a lidar transmitter is conventionally a powerful green (Nd:YAG)-type laser, and transmits a short and intense pulse of light. The pulse is expanded to minimize its divergence, and is directed by a mirror into the atmosphere. As the pulse travels into the atmosphere it is scattered by atmospheric constituents (mostly nitrogen) and aerosol particulates. Light that is backscattered in the field-of-view of a co-aligned telescope is collected and channeled toward detectors by a fiber or other optical devices. The amount of light received is measured as a function of time (or distance) using sensitive photo-detectors, and the signals are digitized. Coordination of the experiment is performed by a timing unit. When each laser pulse exits the atmosphere, another pulse is transmitted and the process is repeated.

As this practical example details, lidars are valuable instruments for atmospheric research because they provide an active remote sensing technique that can probe atmospheric regions inaccessible to other instruments. Those of skill in the art will recognize that there are many applications of lidar/rangefinder/sensing technology that are used in science, industry, and the military.

The related art involves the achievement of outstanding results in the development of effective lasers operating in ultraviolet (UV), visible (Vis), and near infrared (NIR) (up to 3 μm) range of optical spectrum. In contrast to these UV-Vis-NIR results, lasers of the mid-IR spectral range are not so mastered and functionally and practically are not available.

Very well developed oxide laser crystals are not appropriate as mid-IR laser hosts because of their extended phonon spectrum and correspondingly high rate of multi-phonon nonradiative relaxation of excitation. This issue is discussed more fully by T. T. Basiev, Yu. V. Orlovskii, B. I. Galagan, M. E. Doroshenko, I. N. Vorob'ev, L. N. Dmitruk, A. G. Papashvili, V. N. Skvortsov, V. A. Konyushkin, K. K. Pukhov, G. A. Ermakov, V. V. Osiko, A. M. Prokhorov, Evaluation of rare-earth doped crystals and glasses for 4-5 μm lasing, in Laser Physics, 12, No 5 (2002) p. 859-877 and S. A. Kutovoi, "*Growth and laser properties of rare-earth doped lanthanum-scandium borate single crystals*" in Physical-Chemical Aspects Of Technology Of Complex Oxides For Solid State Lasers, Moscow: HayKa, 2002. pp. 128-167. (General Physics Institute Proceedings, ИОФАН; v. 58), the contents of which are fully incorporated herein by references.

Similarly, halide crystal hosts (being materials with relatively short phonon spectrum) were not very successful for lasing in the mid-IR range probably due to a relatively low oscillation strengths or cross-sections of the mid-IR emission. These issues are discussed by Yu. V. Orlovskii, T. T. Basiev, K. K. Pukhov, N. A. Glushkov, O. K. Alimov, S. B. Mirov, in *Multiphonon relaxation of mid IR transitions of rare-earth ions in fluorite type crystals*, Advanced Solid State Photonics Conference, Technical digest, Feb. 1-4, 2004, Santa Fe, USA, WB9. OSA TOPS, the contents of which are fully incorporated herein by reference.

The major difficulty in development of solid state mid-IR laser relates to the fact that relatively small amounts of crystalline hosts possess the necessary combination of properties.

In addition to standard requirements that are imposed upon the hosts for UV-Vis-NIR lasers, crystalline hosts for Mid-IR lasing should possess a very low energy of optical phonon cutoff thus minimizing the nonradiative decay rate and improving the quantum yield.

Those of skill in the solid state arts should, for efficiency reasons, like to have the upper laser level of RE ions in these crystals to be purely radiative with rather large oscillator strength of the laser transition for achieving necessary gain in the 4-6 μm spectral range.

The closest analog of the proposed gain medium is single crystal laser material according to the chemical formula $CaGa_2S_4:Dy^{3+}$, as noted by M. C. Nostrand, R. H. Page, S. A. Payne, W. F. Krupke, and P. G. Shunemann in *Optics Letters*, vol. 24, N 17, pp. 1215-1217, 1999, the contents of which are fully incorporated herein by reference.

This is the first laser medium where laser oscillations of dysprosium ions have been achieved on transition $^6H_{11/2}$-$^6H_{13/2}$ at 4.12 μm with a maximum output energy of 0.12 mJ. The drawback is that the wavelength of this laser corresponds to strong absorption of $CO_2$ molecules and as a consequence experiences strong absorption while propagating in the Earth atmosphere.

What is not appreciated by the prior art is the need for a single crystal laser material with a high cross-section of optical transition, a wavelength shifted to avoid $CO_2$, and a method for fabrication of the same.

Accordingly, there is a need for an improved single crystal laser material that responds to the needs noted above.

OBJECTS AND SUMMARY OF THE INVENTION

An object of the present invention is to provide a single crystal laser lo material that responds to the needs noted above.

Another object of the present invention is to provide method for fabrication of single crystal gain medium with a high cross-section of optical transition, which wavelength is shifted with respect to the analog laser medium to the long wavelength range of optical spectrum where it is not absorbed by $CO_2$ molecules.

The present invention relates to laser materials and specifically to single crystal active media for solid state lasers operating in the middle-infrared (Mid-IR) 4-5 µm range of optical spectrum. Laser radiation of 4-5 mm spectral range is essential for many scientific, technological and defense applications. This radiation corresponds to so-called "window of atmospheric transparency" of the Earth, which in turn leads to small losses when the radiation propagates in the atmosphere. Lasers operating in this spectral range are advantageous for lidar applications, free space communication, environmental monitoring, defense applications, and others.

According to an embodiment of the present invention there is provided a single crystal laser medium of orthorhombic structure with space group $D^{24}_{2h}$-Fddd.

According to another embodiment of the present invention a single crystal layer medium contains Lead, Gallium, Sulfur and is doped with Dysprosium according to general formula: $Pb_{1-3x}Dy_{2x}Ga_2S_4$, wherein x is preferably $0.0001 \leq x \leq 0.05$, and the material has an orthorombic structure.

According to another embodiment of the present invention, there is provided a lasing medium, comprising: at least a first material having a general formula of $Pb_{1-3x}Dy_{2x}Ga_2S_4$, wherein x is preferably $0.00005 \leq x \leq 0.055$, and more preferably $0.0001 < x < 0.05$.

According to another embodiment of the present invention, there is provided a lasing system, comprising: at least one laser, the laser including at least one single crystal laser medium, the laser medium further comprising: lead thiogallate and a dysprosium dopant, and the laser medium having an orthorhombic structure.

According to another embodiment of the present invention, there is provided a lasing system, wherein: the laser medium has a molar formula of $Pb_{1-3x}Dy_{2x}Ga_2S_4$, wherein x is preferably $0.0001 \leq x \leq 0.05$.

According to another embodiment of the present invention, there is provided a method for manufacturing a single crystal laser medium, comprising the steps of: preparing a powdered composition containing Pb, Ga, S, and Dy, placing the powdered composition in a container, evacuating the container, synthesizing the composition, sealing the composition in a crystal growth mechanism under a vacuum, and operating the crystal growth mechanism to grow the single crystal laser medium, whereby an improved laser medium is created enabling an operation within a middle-infrared (Mid-IR) range.

According to another embodiment of the present invention, there is provided a method for manufacturing a single crystal laser medium, wherein: the step of preparing a powdered composition includes a step of: selecting the powders to enable a general formula of $Pb_{1-3x}Dy_{2x}Ga_2S_4$ upon the crystal growth step, wherein x is preferably $0.00005 \leq x \leq 0.055$.

The above and other objects, features and advantages of the present invention will become apparent from the following description read in conduction with the accompanying drawings, in which like reference numerals designate the same elements.

BRIEF DESCRIPTION OF THE DRAWINGS

FIG. 1 shows absorption spectra of dysprosium ions in lead thiogallate crystal for the excitation light polarized along so-called "fast" axis (crystallographic axis a) and perpendicular to the "fast" axis.

FIG. 2A demonstrates the kinetics of photo-luminescence decay of $^6H_{13/2}$ level of $Dy^{3+}$ ions-active ions giving rise to laser oscillation in the mid-IR spectral range.

FIG. 2B demonstrates the kinetics of photo-luminescence decay of $^6H_{11/2}$ level of $Dy^{3+}$ ions-active ions giving rise to laser oscillation in the mid-IR spectral range.

FIG. 2C demonstrates the kinetics of photo-luminescence decay of $^6H_{19/2}$ level of $Dy^{3+}$ ions-active ions giving rise to laser oscillation in the mid-IR spectral range.

FIG. 3 depicts cross-section of emission of $Dy^{3+}$ ions in lead thiogallate crystal (arrow marked dip is due to $CO_2$ absorption in the air).

FIG. 4 demonstrates the dependence of the output energy of the $Pb_{0.985}Dy_{0.01}Ga_2S_4$ crystal at 4.33 µm versus pump energy of $Nd^{3+}$:YAG laser operating at 1.318 µm for different reflectivities of the output coupler. The insert shows the dependence of $-Ln(R_{out})$ versus laser threshold of the same crystal.

DETAILED DESCRIPTION OF REPRESENTATIVE EMBODIMENTS

As noted above, the present invention provides for the development of, in a select embodiment, a single crystal laser medium of orthorhombic structure with space group $D^{24}_{2h}$-Fddd.

As was also noted above, the present invention provides for a single crystal medium containing Lead, Gallium, Sulfur and which is doped with Dysprosium according to general formula: $Pb_{1-3x}Dy_{2x}Ga_2S_4$, where $0.0001<x<0.05$, and a method for manufacturing the same is generally conducted with a Bridgman-Stockbarger zone method. As a practical matter, the crystal growth discussed herein is conducted with the Bridgman-Stockbarger method.

Examples are presented below in practical details and summarized as follows in the table provided.

EXAMPLE 1

Powder for synthesis of dysprosium doped lead thiogallate of $Pb_{0.991}Dy_{0.006}Ga_2S_4$ composition was prepared from the elements of high purity with precision of $3*10^{-4}$ g in the following amounts:

| | |
|---|---|
| Pb | 35.2443 g, |
| Ga | 23.9580 g, |
| S | 21.9785 g, |
| Dy | 0.2388 g, |

The prepared powder was placed in a quartz ampoule, evacuated to a pressure of $2*10^{-5}$ torr, sealed under vacuum with a gas torch and placed in the furnace for further synthesis at 890 Celsius for 24 hours.

The synthesized charge was further placed in the growth ampoule of 24 mm in diameter, which was vacuumed, sealed and positioned in the furnace. Optimal parameters for growth of optically uniform single crystals were as follows:

Growth speed—6 mm per 24 hours
Temperature gradient—8 degrees/cm
Growth direction—(001)

In result, a single crystal of yellow color with a height of 35 mm and diameter of 24 mm of high optical quality has been grown.

EXAMPLE 2

Powder for synthesis of dysprosium doped lead thiogallate of $Pb_{0.991}Dy_{0.006}Ga_2S_4$ composition was prepared from the elements of high purity with precision of $3*10^{-4}$ g in the following amounts:

| | |
|---|---|
| Pb | 24.5515 g, |
| Ga | 16.7428 g, |
| S  | 15.3689 g, |
| Dy | 0.2533 g |

The prepared powder was placed in the quartz ampoule, evacuated (pumped out) to a pressure of $2*10^{-5}$ torr, sealed under vacuum with a gas torch and placed in the furnace for further synthesis at 890 Celsius for 24 hours.

The synthesized charge was further placed in the growth ampoule of 24 mm in diameter, which was vacuumed, sealed and positioned in the furnace. Optimal parameters for growth of optically uniform single crystals were as follows:

Growth speed—6 mm per 24 hours
Temperature gradient—8 degrees/cm
Growth direction—(001)

In result, a single crystal of yellow color with a height of 35 mm and diameter of 24 mm of high optical quality has been grown.

Other crystals with chemical composition shown in Table 1 (see below) have been grown analogously.

Utilization of trivalent dysprosium with stechiometric coefficient x<0.0001, results in a small coefficient of absorption of $^6H_{15/2}$-$^6H_{9/2}$ transition of dysprosium ion and leads to a low efficiency of optical excitation, lower than necessary for achieving laser threshold condition. When x becomes closer to 0.05 the optical quality of the crystal drops due to formation of optical inhomogenities.

For photoluminescence, kinetics and laser oscillation experiments optical elements of different sizes and orientations were cut from the grown crystals. Spectroscopic and laser characterization has been performed with optical elements of lead thiogallate with dysprosium concentration x=0.00005; 0.0005; 0.002, 0.005, 0.01, and 0.04.

The results of characterizations are depicted in figures and tables below.

Laser oscillation on $^6H_{13/2}$-$^6H_{11/2}$ transition of dysprosium has been obtained with optical elements of lead thiogallate with dysprosium concentration of x=0.002; 0.005 for crystals cut along 001 and 100 directions.

TABLE 1

Chemical composition of single crystal medium and its characteristics

| | | Charge composition, g. | | | | Growth speed | Average size (length), | Optical quality of |
|---|---|---|---|---|---|---|---|---|
| No | Chemical formula | Pb | Dy | Ga | S | mm/day | mm | crystals* |
| 1 | $Pb_{0.99985}Dy_{0.0001}Ga_2S_4$ | 32.6755 | 0.0025 | 21.3589 | 20.2235 | 6 | 50 | ++ |
| 2 | $Pb_{0.9985}Dy_{0.001}Ga_2S_4$ | 29.8734 | 0.0234 | 19.5566 | 18.5170 | 6 | 50 | ++ |
| 3 | $Pb_{0.994}Dy_{0.004}Ga_2S_4$ | 28.6943 | 0.0905 | 19.4270 | 17.8666 | 6 | 48 | ++ |
| 4 | $Pb_{0.985}Dy_{0.01}Ga_2S_4$ | 31.8951 | 0.2539 | 21.1663 | 20.0411 | 6 | 49 | ++ |
| 5 | $Pb_{0.97}Dy_{0.02}Ga_2S_4$ | 31.9113 | 0.5160 | 21.5045 | 20.3613 | 3 | 47 | ++ |
| 6 | $Pb_{0.94}Dy_{0.04}Ga_2S_4$ | 30.6254 | 1.0221 | 21.2966 | 20.1645 | 3 | 48 | ++ |
| 7 | $Pb_{0.88}Dy_{0.08}Ga_2S_4$ | 30.6457 | 2.1849 | 23.4360 | 21.5536 | 3 | 48 | ++ |
| 8 | $Pb_{0.85}Dy_{0.1}Ga_2S_4$ | 31.1640 | 2.8754 | 24.6736 | 22.6918 | 3 | 43 | -- |

*Note:
Evaluation of the optical quality of grown crystals was performed by changes of diffraction pattern according to Fraunhofer method.
--- poor optical quality,
++- high optical quality.

Referring now to FIG. 1, due to the fact that lead thiogallate is a biaxial crystal, there are at least two different absorption spectra of the crystal corresponding to two different orientation of excitation light polarization plane with respect to 100 direction (so-called fast axis).

Therewith, crystal absorption is 1.5 times larger for the excitation light polarized along the "fast" optical axis. It is noteworthy that the absorption line of $Dy^{3+}$ for absorption transition $^6H_{15/2}$-$^6H_{9/2}$, used for Nd:YAG pumping, due to a higher degree of covalency of the ion-ligand bond, is shifted towards a long wavelength range with respect to a known calcium thiogallate crystal, being better overlapped with the wavelength of the pump radiation.

Furthermore, the absorption coefficients for the $^6H_{15/2}$-$^6H_{9/2}$ transition for both polarizations of the pump light are higher for the proposed lead thiogallate crystal with respect to the calcium thiogallate, while the difference in values of the absorption coefficients at 1.318 pm for polarizations of the excitation light along and perpendicular to the "fast" optical axis is less essential for the lead thiogallate crystal (~2 fold) with respect to calcium thiogallate, where this difference is close to 5 fold.

It should be understood by those of skill in the art, that this advantageous feature of lead thiogallate crystals leads to possibility of utilization of both polarizations for pumping these crystals.

Unpolarized absorption spectrum of dysprosium ions in lead thigallate crystal has been used for further analysis according to Judd-Ofelt model.

For achieving effective pumping of $Dy^{3+}$ ions in $Pb_{1-3x}Dy_{2x}Ga_2S_4$ crystals, where x=0.002 and x=0.005, we used a pump Nd:YAG laser operating at 1.318 μm in free running oscillation with a pulse duration of 150 μs, or in a mode of acousto-optical Q-switching with a pulse duration of 40 ns.

Referring now to FIGS. 2A, 2B, and 3C, demonstrated are the kinetics of luminescence for different transitions participating in the process of laser oscillation. As shown, a relatively small lifetime of the $^6H_{9/2}$ level, directly excited by the pump radiation, results in a very effective population of the upper $^6H_{11/2}$ laser level as will be understood by those of skill in the art. As this takes place, the optical transition $^6H_{11/2}$-$^6H_{13/2}$ (laser oscillation transition at a wavelength 4.33 μm) is self-terminated due to the fact that the lifetime of the lower laser level is practically three times bigger than that of the upper level.

The intensity parameters for different transitions obtained from a Judd-Ofelt analysis have been used for estimation of radiative lifetimes of levels participating in the laser oscillation process. As shown in Table 2, the calculated lifetime (lifetimes being generally shown as "τ", for example $\tau_{rad}$ for a radiative lifetime or $\tau_{meas}$ for a measured lifetime) of the lower $^6H_{13/2}$ level of dysprosium is in a good agreement with a measured one. Quantum efficiency of luminescence of this level is approximately ~100%, because the contribution of non-radiative relaxation in population decay of this level is negligibly-small due to a large energy gap between this level and lower levels.

Referring now to FIG. 3, the photoluminescence spectra of $Pb_{1-3x}Dy_{2x}Ga_2S_4$, crystals (0.0001<x<0.05) recalculated in the units of emission cross-sections are depicted. As one can see from FIG. 3, the most intensive line in the emission spectrum with a maximum value of cross-section $\sigma_{max}$=1x10$^{-20}$ cm$^2$ corresponds to $^6H_{11/2}$-$^6H_{13/2}$ transition and the wavelength of 4.3 μm. The true shape of this line is only slight distorted due to absorption of atmospheric $CO_2$ molecules.

This constitutes another important advantageous property of lead thiogallate with respect to analog calcium thiogallate crystal: $Dy^{3+}$ in $PbGa_2S_4$ features a long wavelength shift of its luminescence maximum with respect to absorption of $CO_2$ molecules, and hence, there appear opportunity to obtain room temperature mid-IR lasing of $Dy^{3+}$ in $PbGa_2S_4$ at the wavelength having maximum value of emission cross-section (corresponding to the range of atmospheric transparency) without purging the laser cavity with inert gas, while laser based on dysprosium doped calcium thiogallate requires inert gas purging for $CO_2$ displacement.

TABLE 2

Spectroscopic characteristics of the proposed single crystal laser medium

| Transition | Wavelength λ, μm | Radiative lifetime $\tau_{rad}$, ms | Measured lifetime $\tau_{meas}$, ms | Quantum yield, η | Branching ratio, β |
|---|---|---|---|---|---|
| $^6F_{11/2}$, $^6H_{9/2}$-$^6H_{15/2}$ | 1.32 | 0.258 | 0.160 | 0.62 | 0.87 |
| $^6F_{11/2}$, $^6H_{9/2}$-$^6H_{11/2}$ | 2.4 | 0.258 | 0.160 | 0.62 | 0.12 |
| $^6H_{11/2}$-$^6H_{13/2}$ | 4.3 | 2.23 | 2.0 | 0.90 | 0.05 |
| $^6H_{13/2}$-$^6H_{15/2}$ | 2.9 | 6.62 | 6.6 | 1.00 | 1.00 |

Referring now to FIG. 4, measured dependences of output energy versus absorbed pump energy for reflectivities of the output coupler of 98 and 96% are depicted. As one can see from FIG. 4 for $Pb_{0.985}Dy_{0.01}Ga_2S_4$ or $Pb_{0.994}Dy_{0.004}Ga_2S_4$ crystals cut along 001 direction (when only absorption corresponding to curve (a) of FIG. 1 could be realized) the maximum output energy of 0.32 mJ, differential slope of 1%, and real efficiency of 0.6% were obtained for 96% output coupler.

It is noteworthy that approximately 3 times smaller output energy has been obtained in the M. C. Nostrand reference noted above for the analog $Dy^{3+}$:$CaGa_2S_4$ laser for the output coupler of 96.5% in the cavity being purged by nitrogen.

Comparative characteristics of the known dysprosium doped calcium thiogallate and novel dysprosium doped lead thiogallate crystals are depicted in Table 3. As evident from Table 3, the lifetimes of all the studied levels of lo dysprosium ions in lead thiogallate crystal are shorter than corresponding lifetimes in calcium thiogallate crystal.

What is more, for the $^6H_{13/2}$ level the energy gap to the lower lying $^6H_{15/2}$ level is too large to provide significant contribution of non-radiative decay in depopulation of this level. This let us draw a conclusion about enhanced probabilities of radiative transitions of dysprosium ions in the proposed lead thiogallate with respect to known calcium thiogallate crystals. It is also evident from the measured lead thiogallate cross-section of emission, which is ~1.4 times larger than that in calcium thiogallate crystal.

TABLE 3

Comparative spectroscopic characteristics of the prototype and proposed single crystal laser medium.

| Crystal | Parameter | | | |
|---|---|---|---|---|
| | $\tau(^6H_{13/2})$, ms | $\tau(^6H_{11/2})$, ms | $\tau(^6H_{9/2} + ^6F_{11/2})$, μs | $\sigma_{em}$, ×10$^{-20}$ CM$^2$ |
| $CaGa_2S_4$: $Dy^{3+}$ | 7.85 | 3.02 | 200 | 0.7 |
| $Pb_{1-3x}Dy_{2x}Ga_2S_4$ where 0.001 < x < 0.05 | 6.6 | 2.0 | 160 | 1.0 |

Based on the study of optical characteristics of the proposed laser medium those of skill in the art will be able to conclude that the proposed laser medium constitutes a single crystal laser material with spectroscopic and laser parameters exceeding that of the prototype.

Specifically, the proposed laser medium features a higher probability of optical transitions and its emission wavelength is shifted to the long wavelength range where there is no atmospheric absorption.

As a consequence, those of skill in the art will recognize that at least one of the objectives noted above has been realized, and consequently that the proposed laser medium is not obvious to those of skill in the area of mid-IR lasers. In sum, the present laser material is novel and promising for numerous scientific, industrial, and defense applications.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A single crystal laser medium, comprising:
a material having a general formula of $Pb_{1-3x}Dy_{2x}Ga_2S_4$, wherein x is preferably $0.0001 \leq x \leq 0.05$.

2. A single crystal laser material, according to claim 1, wherein:
said material has an orthorombic structure; and
said orthorombic structure has a space group $D^{24}_{2h}$-Fddd.

3. A lasing medium, comprising:
at least a first material having a general formula of $Pb_{1-3x}Dy_{2x}Ga_2S_4$; wherein x is preferably $0.00005 \leq x \leq 0.055$.

4. A lasing medium, according to claim 3, wherein:
x is preferably $0.0001 \leq x \leq 0.05$.

5. A lasing medium, according to claim 4, wherein:
x is preferably $0.0002 < x < 0.05$.

6. A lasing system, comprising:
at least one laser;
said laser including at least one single crystal laser medium having a general formula of $Pb_{1-3x}Dy_{2x}Ga_2S_4$, wherein x is $0.0001 \leq x \leq 0.05$;
said laser medium further comprising:
lead thiogallate and a Dysprosium dopant; and
said laser medium having an orthorhombic structure.

7. A lasing system, according to claim 6, wherein:
said laser medium has a molar formula of $Pb_{1-3x}Dy_{2x}Ga_2S_4$; wherein x is $0.0001 \leq x \leq 0.05$.

* * * * *